United States Patent
Aonuma

(10) Patent No.: US 8,168,049 B2
(45) Date of Patent: May 1, 2012

(54) SPUTTERING APPARATUS AND METHOD OF MANUFACTURING SOLAR BATTERY AND IMAGE DISPLAY DEVICE BY USING THE SAME

(75) Inventor: Daisuke Aonuma, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 403 days.

(21) Appl. No.: 12/468,238

(22) Filed: May 19, 2009

(65) Prior Publication Data

US 2009/0288944 A1    Nov. 26, 2009

(30) Foreign Application Priority Data

May 20, 2008  (JP) .................................. 2008-131795

(51) Int. Cl.
  *C23C 14/35* (2006.01)
(52) U.S. Cl. ......... 204/298.11; 204/298.07; 204/298.18; 204/298.23; 204/298.25; 204/192.26; 204/192.29
(58) Field of Classification Search ............. 204/298.07, 204/298.08, 298.11, 298.23, 298.25, 298.18, 204/192.26, 192.29
See application file for complete search history.

(56) References Cited

U.S. PATENT DOCUMENTS

| | | | | | |
|---|---|---|---|---|---|
| 5,415,757 | A | * | 5/1995 | Szcyrbowski et al. | 204/298.08 |
| 5,753,092 | A | * | 5/1998 | Hollars et al. | 204/298.26 |
| 5,763,851 | A | * | 6/1998 | Forster et al. | 219/121.43 |
| 5,800,688 | A | * | 9/1998 | Lantsman et al. | 204/298.11 |
| 5,833,815 | A | * | 11/1998 | Kim et al. | 204/192.12 |
| 2002/0046945 | A1 | * | 4/2002 | Hosokawa et al. | 204/298.18 |

FOREIGN PATENT DOCUMENTS

EP   0 450 163 A1 * 10/1991
JP   01-108369      4/1989

* cited by examiner

*Primary Examiner* — Rodney McDonald
(74) *Attorney, Agent, or Firm* — Fitzpatrick, Cella, Harper & Scinto

(57) ABSTRACT

A sputtering apparatus of a continuous system that a first target 17a and a second target 17b are arranged to obliquely face a substrate 6 and other targets to form a film while conveying the substrate 6 along a conveying path 15, wherein shields 19a, 19b facing the conveying direction of at least the substrate 6 are provided between the conveying path 15 and the first and second targets 17a, 17b to have therebetween an extended region toward the conveying path 15 in the space between the first target 17a and the second target 17b to enable to obtain a high quality film and to enable to prevent particles from diffusing in a chamber 3.

14 Claims, 10 Drawing Sheets

Fig. 3-A
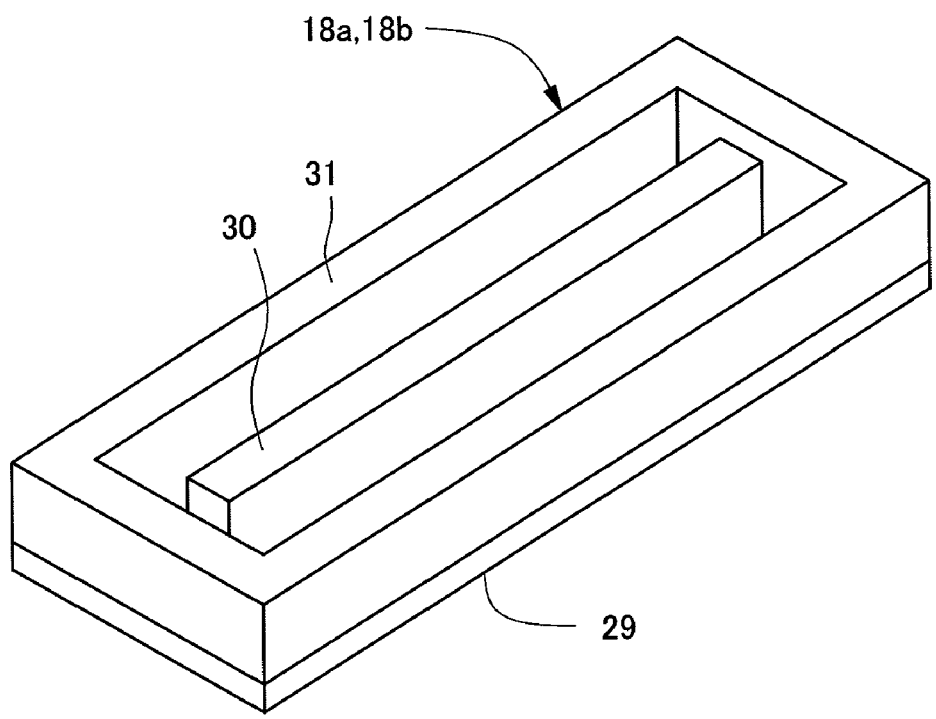
Fig. 3-B
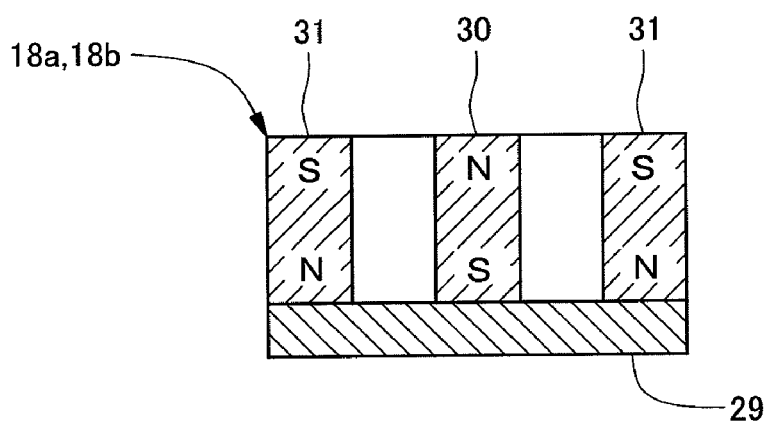

SPUTTERING APPARATUS AND METHOD OF MANUFACTURING SOLAR BATTERY AND IMAGE DISPLAY DEVICE BY USING THE SAME

BACKGROUND OF THE INVENTION

The present invention relates to a sputtering apparatus used for manufacturing, for example, various types of semiconductor devices, magnetic devices, electronic parts and optical components, and a method of manufacturing a solar battery and an image display device by using the sputtering apparatus.

Sputtering is a thin film forming process in which plasma is generated in rare gas such as Ar (argon), krypton (Kr) or xenon (Xe), ions of the rare gas collide with a target to expel the target substance, and the target substance is deposited as a thin film on a substrate. At present, argon gas is mostly used as the sputtering gas. Accordingly, description is made using Ar as the sputtering gas in this specification, but it is needless to say that the same manner can be applied to a sputtering apparatus using another rare gas. And, to improve a film-forming speed on the substrate, magnetron sputtering has a magnet device on the back side of the target to generate a required magnetic field near the surface of the target, thereby enhancing a plasma density.

A sputtering apparatus having a flat-shaped target is mainly used for production of semiconductors and electronic parts. Especially, for a flat panel display (FPD) among the electronic parts, a sputtering apparatus provided with a sputtering cathode of a rectangular magnetron method is used to form electrodes and wires. As the FPD, there are a liquid crystal display, a plasma display, an organic EL display and the like. In recent years, the FPD is becoming large, and the sputtering apparatus is being required to deposit a thin film on a large-area substrate.

There are generally two methods of sputtering for film formation on a large substrate.

One of them is a batch system by which a large target or a split target is sputtered with a substrate in a stationary state, and the sputtered particles flying from the sputtered target are adhered onto the film-forming surface of the substrate to form a film on it.

The other is a continuous system by which a long and thin target whose longitudinal direction is directed to a transverse direction of the conveying direction is sputtered while conveying a substrate on which a film is to be formed, and the sputtered particles being flying from the target are adhered onto the film-forming surface of the substrate to form a film on it. This long and thin target may have a rectangular or cylindrical shape.

Either of the above systems positions the target at the front with respect to the substrate, so that its film-forming speed is high, but the substrate and the film being produced are directly influenced by radiation heat of plasma. By configuring in this way, ions having high energy hit the target, the target particles flown out by the energy enter the substrate surface, and other recoil neutral particles and others collide with the substrate to damage the film.

Therefore, there is conventionally proposed the sputtering apparatus of an obliquely opposed target method as described in JP-A 1-108369 (KOKAI). Specifically, there is a known sputtering apparatus which has plural targets arranged to obliquely face the substrate and other targets. This sputtering apparatus of the obliquely opposed target method improves a film-forming speed by utilizing the fact that the number of particles flying out in an oblique direction with respect to the normal of the target surface is many.

BRIEF SUMMARY OF THE INVENTION

But, the above-described conventional sputtering apparatus of an obliquely opposed target method is used for the above-described batch system, and if used for the continuous system, it has the following problems.

Specifically, since the continuous system forms a film while conveying the substrate, the particles are flying to adhere to the substrate before the substrate reaches just above the target or even after it passes just above the target to cause degradation of the film quality. And, depending on an inclined angle of a target, penetration of high energy particles or recoil neutral particles, which cause damage to the film, cannot be prevented, causing degradation of the film quality as a result.

In addition, the particles are diffused into the chamber through between the substrate and the target, resulting in increasing the maintenance time and maintenance cost. The particles adhere to the chamber walls and other portions facing a vacuum and may separate for some reason to reach the substrate. Then, the particles become masks in the next step and cause defective film formation or defective etching at the pertinent portions in the next step.

The present invention has been made in view of the above circumstances and provides a high quality film by a sputtering apparatus of a continuous system, which has plural targets arranged to obliquely face the substrate and other targets, and prevents particles from diffusing in a chamber. And, it enables to improve the quality of a solar battery and an image display device.

In the sputtering apparatus of the invention, a conveying path for conveying a substrate is disposed in a sputtering chamber to which an exhaust device is connected, and a first cathode for holding a first target obliquely opposed toward the front in the conveying direction of the substrate and a second cathode for holding a second target obliquely opposed toward the back in the conveying direction of the substrate are arranged to obliquely oppose mutually to the conveying path. And, for the above purpose, the sputtering apparatus of the invention is provided with shields, which are opposed to the conveying direction of the substrate, are disposed between the conveying path and the first and second cathodes with extended regions toward the conveying path in the space between the first target and the second target between them.

The present invention also provides a method for production of a solar battery or an image display device, which has a process of forming a film by the above-described sputtering apparatus.

In the sputtering apparatus of the invention, shields, which are opposed to the conveying direction of at least the substrate, are disposed between a conveying path and the first and second targets having therebetween an extended region toward the conveying path in the space between the first target and the second target. Therefore, the particles which cause degradation of the film quality by flying out of the above-described extended region to collide with the substrate can be adhered to the shields aggressively. Thus, a high quality film can be deposited.

Since the substrate and the targets are blocked from each other by shields, the particles can be prevented from diffusing into the chamber through between the substrate and the targets. Therefore, an increase in maintenance time and cost due to the adhesion of the particles to the chamber walls and other portions facing a vacuum can be prevented. At the same time, defective film formation or defective etching in the next process due to the separation of the adhered particles and the adhesion to the substrate can also be prevented.

In addition, according to the method of producing a solar battery or an image display device of the present invention, the sputtering apparatus of the invention can be used to form a high quality film, so that the quality of the produced solar battery or image display device can be improved.

BRIEF DESCRIPTION OF THE SEVERAL VIEWS OF THE DRAWINGS

FIG. 3 is a diagram showing a magnet unit, FIG. 3-A is a perspective view, and FIG. 3-B is a sectional view.

DETAILED DESCRIPTION OF THE INVENTION

Typical embodiments of the invention will be described with reference to the accompanying drawings. In the respective drawings described below, like reference symbols refer to substantially like or corresponding members.

First, one example of the sputtering apparatus according to the invention is described with reference to FIG. 1 through FIG. 3.

Figure 1:
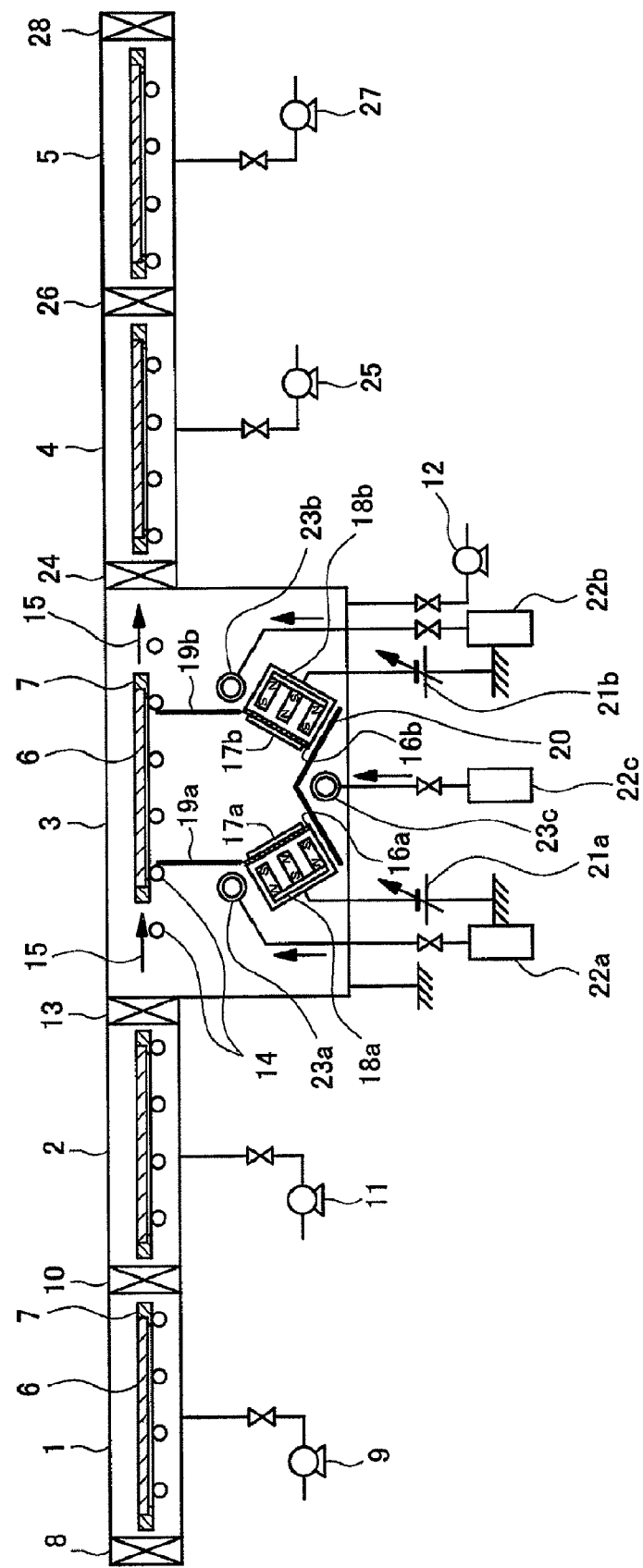
FIG. 1 is a schematic side sectional view showing a whole structure of a sputtering apparatus according to the invention.

FIG. 1 is a schematic side sectional view showing a whole structure of the sputtering apparatus according to the invention. FIG. 2 is an enlarged view of a sputtering chamber portion in FIG. 1. FIG. 3 is a diagram showing a magnet unit, FIG. 3-A is a perspective view, and FIG. 3-B is a sectional view.

As shown in FIG. 1, the sputtering apparatus of this example is a continuous apparatus and has a load-lock chamber 1, a subload-lock chamber 2, a sputtering chamber 3, a subunload-lock chamber 4 and an unload-lock chamber 5 sequentially arranged in series from left to right in the drawing.

A substrate 6 is placed on a tray 7, and a load door valve 8 provided at the outer end side of the load-lock chamber 1 is opened to load into the load-lock chamber 1. After the substrate 6 placed on the tray 7 is loaded into the load-lock chamber 1, the load door valve 8 is closed, and the interior of the load-lock chamber 1 is roughly vacuumed to about 20 Pa by an exhaust device 9 connected to the load-lock chamber 1. The tray 7 has a frame shape having an open inside, and a film is formed on the substrate 6 through the opening.

After roughly vacuuming, a gate valve 10 between the load-lock chamber 1 and the subload-lock chamber 2 is opened, the substrate 6 placed on the tray 7 is conveyed into the subload-lock chamber 2. After the substrate 6 placed on tray 7 is loaded into the subload-lock chamber 2, the gate valve 10 is closed, the interior of the subload-lock chamber 2 is exhausted to a high vacuum by an exhaust device 11 connected to the subload-lock chamber 2. As the exhaust device 11, a cryopump or a TMP (turbomolecular pump) is used.

The sputtering chamber 3 is connected to an exhaust device 12 such as a cryopump or TMP (turbomolecular pump), and the interior of the sputtering chamber 3 can be exhausted to a high vacuum by the exhaust device 12. The interior of the sputtering chamber 3 is previously exhausted to a high vacuum ($2\times10$ Pa to $2\times10^{-5}$ Pa). After the interior of the subload-lock chamber 2 is exhausted, a gate valve 13 between the subload-lock chamber 2 and the sputtering chamber 3 is opened, and the substrate 6 placed on the tray 7 is conveyed into the sputtering chamber 3. Within the sputtering chamber 3, a conveying path 15 is provided to be continuous from the load-lock chamber 1 and the subload-lock chamber 2 to the subunload-lock chamber 4 and the unload-lock chamber 5 by, for example, guide rollers 14 or the like. The substrate 6 placed on the tray 7 is conveyed at a given feed speed along the conveying path 15 in the sputtering chamber 3. And, a film is formed on the substrate 6 while conveying in the sputtering chamber 3 by sputtering using a first target 17a held by a first cathode 16a and a second target 17b held by a second cathode 16b.

Reference numerals 18a, 18b are magnet units, 19a, 19b, 20 are shields, 21a is a first DC power source, 21b is a second DC power source, 22a to 22c are gas supply sources, and 23a to 23c are gas supply portions.

The film is formed while the substrate 6 is being conveyed. After the substrate 6 has passed between the shields 19a, 19b, the substrate 6 placed on the tray 7 is pulled into a subunload-lock chamber 4 through a gate valve 24 between the sputtering chamber 3 and the subunload-lock chamber 4. The subunload-lock chamber 4 is previously exhausted to a high vacuum by a connected exhaust device 25.

After the substrate 6 placed on the tray 7 is conveyed into the subunload-lock chamber 4, the gate valve 24 is closed, and gate valve 26 between the subunload-lock chamber 4 and the unload-lock chamber 5 is opened. It is preferable that the interior of the unload-lock chamber 5 is roughly vacuumed previously by an exhaust device 27.

The substrate 6 placed on the tray 7 is conveyed into the unload-lock chamber 5 through the gate valve 26, then the gate valve 26 is closed immediately, and the unload-lock chamber 5 is vented to return to the atmospheric pressure. When the interior of the unload-lock chamber 5 is returned to the atmospheric pressure, an unload door valve 28 which is disposed on the outer end side of the unload-lock chamber 5 is opened, and the substrate 6 placed on the tray 7 is conveyed out of the vacuum system. The substrate 6 is removed from the tray 7 in the atmosphere. Thus, a desired film is formed.

The sputtering chamber 3 is described below with reference to FIG. 2 and FIG. 3.

The interior of the sputtering chamber 3 can be evacuated to about $2\times10$ Pa to $2\times10^{-5}$ Pa by the exhaust device 12. The degree of vacuum is adjusted to an optimum degree of vacuum by the each process.

In this example, the conveying path 15 for the substrate 6 is provided at an upper part of the sputtering chamber 3, and the first target 17a having a flat plate shape held by the first cathode 16a and the second target 17b having a flat plate shape held by the second cathode 16b are provided below it. The first cathode 16a and the second cathode 16b have a rectangular shape with the transverse direction of the conveying path 15 in a direction of the long side. The first target 17a and the second target 17b also have the same rectangular shape as the first cathode 16a and the second cathode 16b.

The first cathode 16a is obliquely opposed to the conveying path 15 toward the front in the conveying direction of the substrate 6, and the second cathode 16b is obliquely opposed to the conveying path 15 toward the back in the conveying direction of the substrate 6. And, the first cathode 16a and the second cathode 16b are arranged to obliquely face each other.

The plate-like shields 19a, 19b are disposed between the conveying path 15 and the first and second cathodes 16a, 16b to have therebetween extended regions ranging from the first cathode 16a and the second cathode 16b toward the conveying path 15 in the space between the first target 17a and the second target 17b. The shields 19a, 19b are disposed to face the conveying direction of the substrate 6. The provision of the shields 19a, 19b can suppress the particles from flying out of the region sandwiched between the shields 19a, 19b. The ends of the shield 19a and the shield 19b on the side of the conveying path 15 are preferable that in order to effectively suppress the particles from flying out of the above region, the vertical line erected at an end of the second target 17b or the first target 17a positioned on the opposed side on the side of the conveying path 15 is present exceeding points intersecting with the shield 19a and the shield 19b as indicated by the broken line arrows in FIG. 2.

The apparatus of this example has the angle shield 20 disposed below the first target 17a and the second target 17b. The shield 20 is not an essential member, but its provision is preferable to suppress the particles from adhering to the lower wall surface of the sputtering chamber 3.

The back sides of the first cathode 16a and the second cathode 16b are provided with the magnet units 18a, 18b which can generate a closed loop shape magnetic field on the surfaces of the first target 17a and the second target 17b and can develop a magnetron phenomenon. The magnet units 18a, 18b have a rectangular shape having the transverse direction of the conveying path 15 as a direction of the long side, and it is configured that a center magnet 30 disposed at the center of a yoke 29 is surrounded by an outer peripheral magnet 31 as also shown in FIG. 3. The center magnet 30 and the outer peripheral magnet 31 have a reverse polarity, and the magnet units 18a, 18b are slidable in a direction of the short side. When the magnet units 18a, 18b are reciprocally slid in the direction of the short side during the film forming process, a magnetic field can be uniformly acted on the whole surfaces of the first cathode 16a and the second cathode 16b. And, since the whole surfaces of the first cathode 16a and the second cathode 16b are uniformly sputtered, the target can be consumed uniformly, and the film to be deposited on the substrate 6 can be made to have a more uniform thickness.

The gas supply portions 23a, 23b are disposed on the sides of the backs (opposite sides of the mutually opposed surfaces of the shields 19a, 19b) of the shields 19a, 19b which have therebetween the extended regions ranging toward the conveying path 15 in the space between the first target 17a and the second target 17b. The gas supply portion 23c is also disposed behind the shield 20 which is disposed below the first target 17a and the second target 17b. The gas supply portions 23a, 23b, 23c are supplied with a sputtering gas (Ar gas) or a film forming reactive gas from the gas supply sources 22a, 22b, 22c via a massflow controller. The provision of the gas supply portions 23a, 23b, 23c behind the shields 19a, 19b, 20 can prevent the sputtered particles and the reaction product of the sputtered particles and the reactive gas from depositing at the gas supply portions 23a, 23b, 23c.

In the present invention, the surfaces of the shields 19a, 19b, 20 which are exposed to the space between the first target 17a and the second target 17b or the extended regions in the space toward the conveying path 15 are determined as the front faces, and the opposite surfaces are determined as the back surfaces.

The DC power sources 21a, 21b are connected to the first cathode 16a and the second cathode 16b respectively. And, the sputtering chamber 3 and the shields 19a, 19b, 20 are grounded. The first cathode 16a and the second cathode 16b constitute a cathode, and the chamber wall and the shields 19a, 19b, 20 in the sputtering chamber 3 constitute an anode.

The above-described sputtering chamber 3 is operated by supplying a DC voltage from the DC power sources 21a, 21b to the first cathode 16a and the second cathode 16b while supplying necessary gas from the gas supply portions 23a, 23b, 23c. The sputtered particles are generated from first target 17a and the second target 17b by supplying the gas and the DC voltage and flown within the region mainly surrounded by the shields 19a, 19b, 20 and the first target 17a and the second target 17b to form a film. At this time, the uniform film can be deposited on the substrate 6 by reciprocally sliding the magnet units 18a, 18b in the direction of the short side as described above.

Another example of the sputtering chamber 3 is described below.

Figure 2:
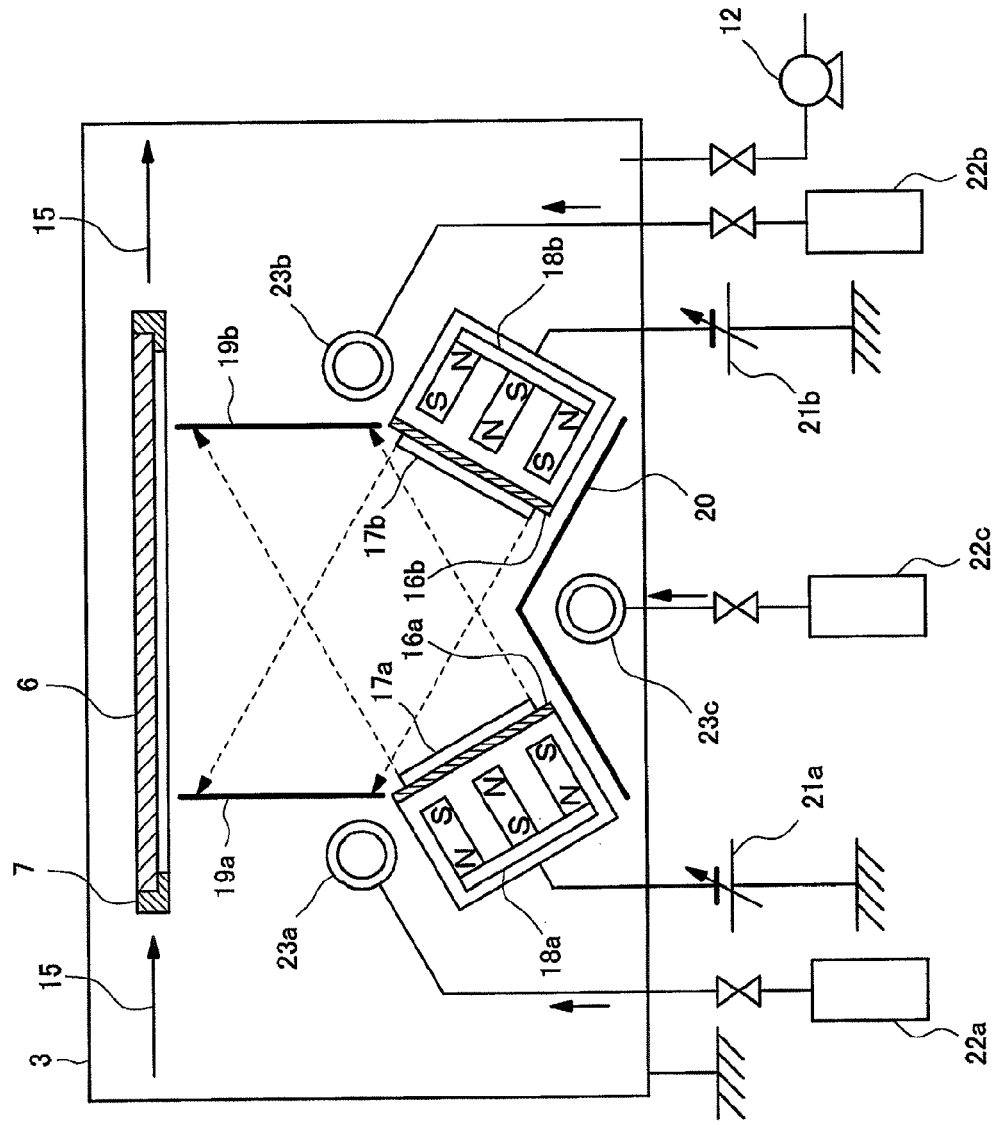
FIG. 2 is an enlarged view of a sputtering chamber portion in FIG. 1.
Figure 4:
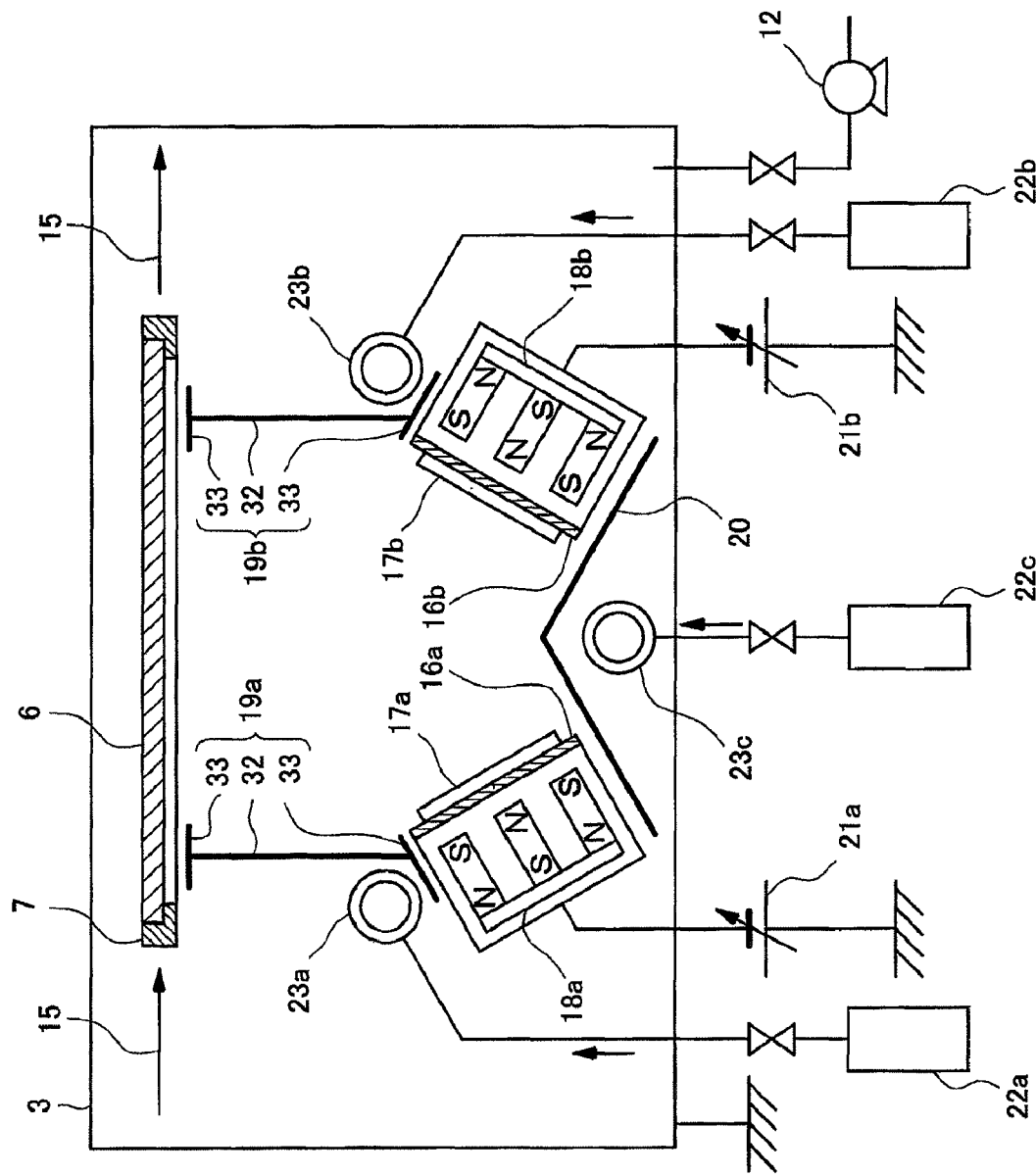
FIG. 4 is a schematic sectional view showing a second example of the sputtering chamber.

FIG. 4 is a schematic sectional view showing a second example of the sputtering chamber 3, which is basically configured in the same manner as the sputtering chamber 3 shown in FIG. 2, but the shields 19a, 19b are different. The shields 19a, 19b of FIG. 2 are configured of one plate material, but the shields 19a, 19b of this example are configured of center plate portions 32 which are disposed to mutually face and end plate portions 33 which are disposed at ends of the center plate portion 32. The end plate portions 33 each are attached to the end of the center plate portion 32 on the side of the conveying path 15 and the ends on the sides of the first target 17a and the second target 17b in a direction to intersect with the center plate portion 32. The provision of the end plate portions 33 makes it easier to prevent the sputtered particles from flying out of the region surrounded by the shields 19a, 19b, 20, the first target 17a and the second target 17b.

Figure 5:
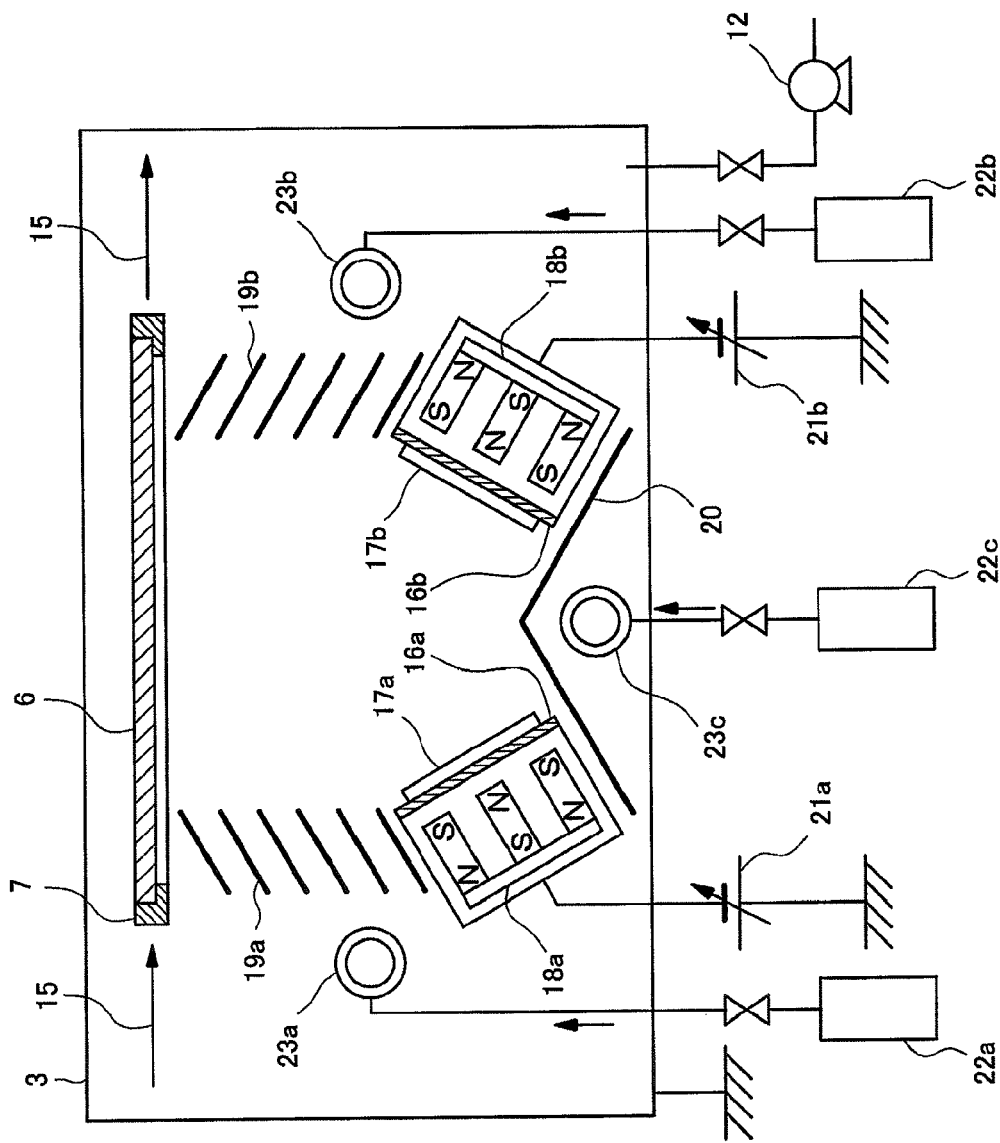
FIG. 5 is a schematic sectional view showing a third example of the sputtering chamber.

FIG. 5 is a schematic sectional view showing a third example of the sputtering chamber 3, which is basically configured in the same manner as the sputtering chamber 3 shown in FIG. 2, but the shields 19a, 19b are different. The shields 19a, 19b of this example are configured of plural plate members which have an inclination on the planes perpendicular to the conveying path 15 and have a form of blinds through which the surfaces on the other sides with respect to the shields 19a, 19b are not visible when viewed from a direction perpendicular to a plane formed by connecting from the space between the first target 17a and the second target 17b to the center of the surfaces of the shields 19a, 19b. The blind type shields 19a, 19b can make the sputtered particles hard to flow out while keeping the gas flow inside and outside of the shields 19a, 19b in a good condition. In other words, the shields 19a, 19b have a shape which is protruded externally, namely a dogleg shape when viewed from the inside of the opposed shields 19a, 19b.

Figure 6:
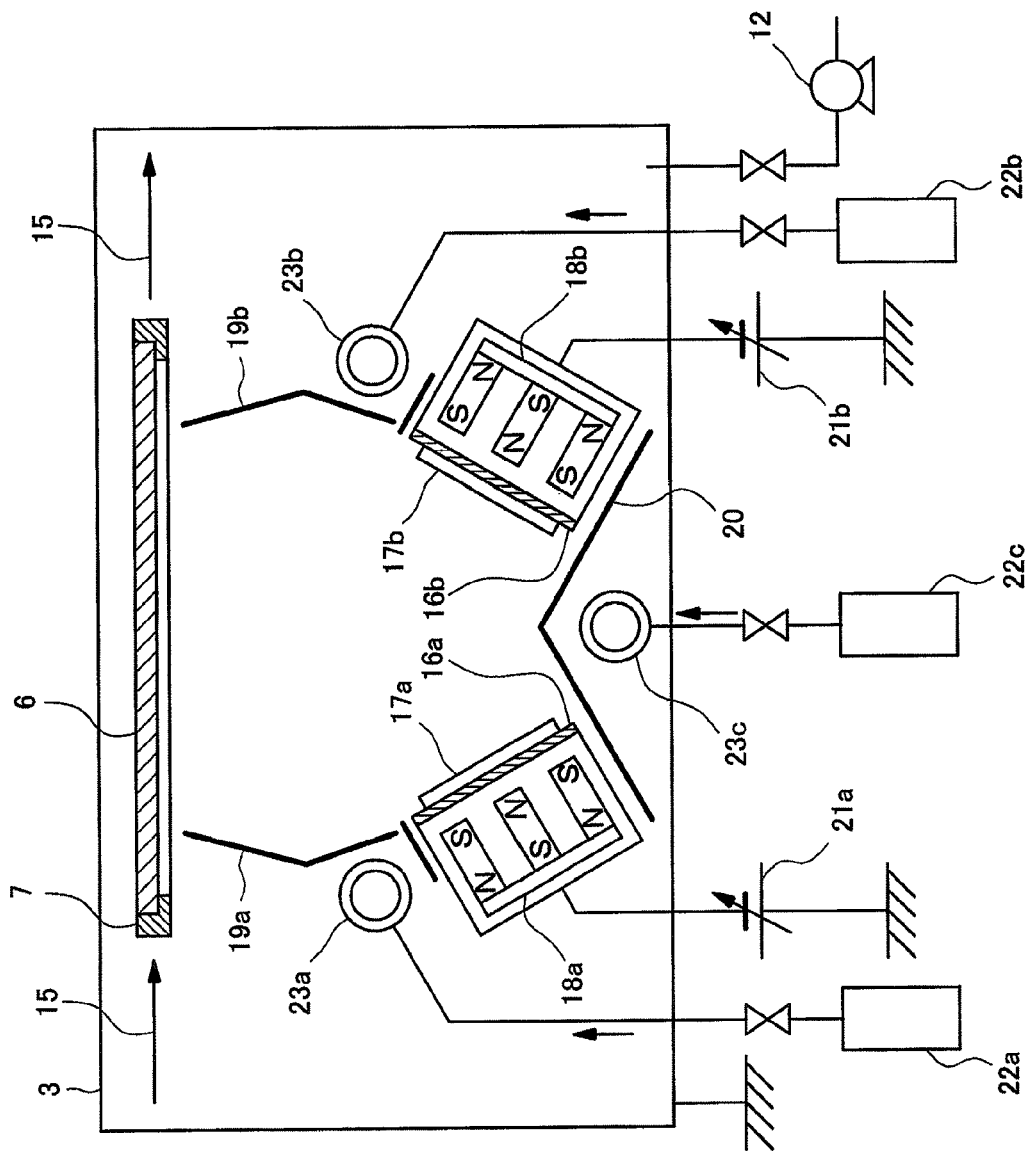
FIG. 6 is a schematic sectional view showing a fourth example of the sputtering chamber.

FIG. 6 is a schematic sectional view showing a fourth example of the sputtering chamber 3, which is basically configured in the same manner as the sputtering chamber 3 shown in FIG. 2, but the shields 19a, 19b are different. The shields 19a, 19b of this example have a dogleg shape which has an end on the side of the conveying path 15 and an end on the side of the first target 17a or the second target 17b bent to have a concave shape toward the front side. The configured shields 19a, 19b make it easy to catch the particles which cause degradation of the film quality.

Figure 7:
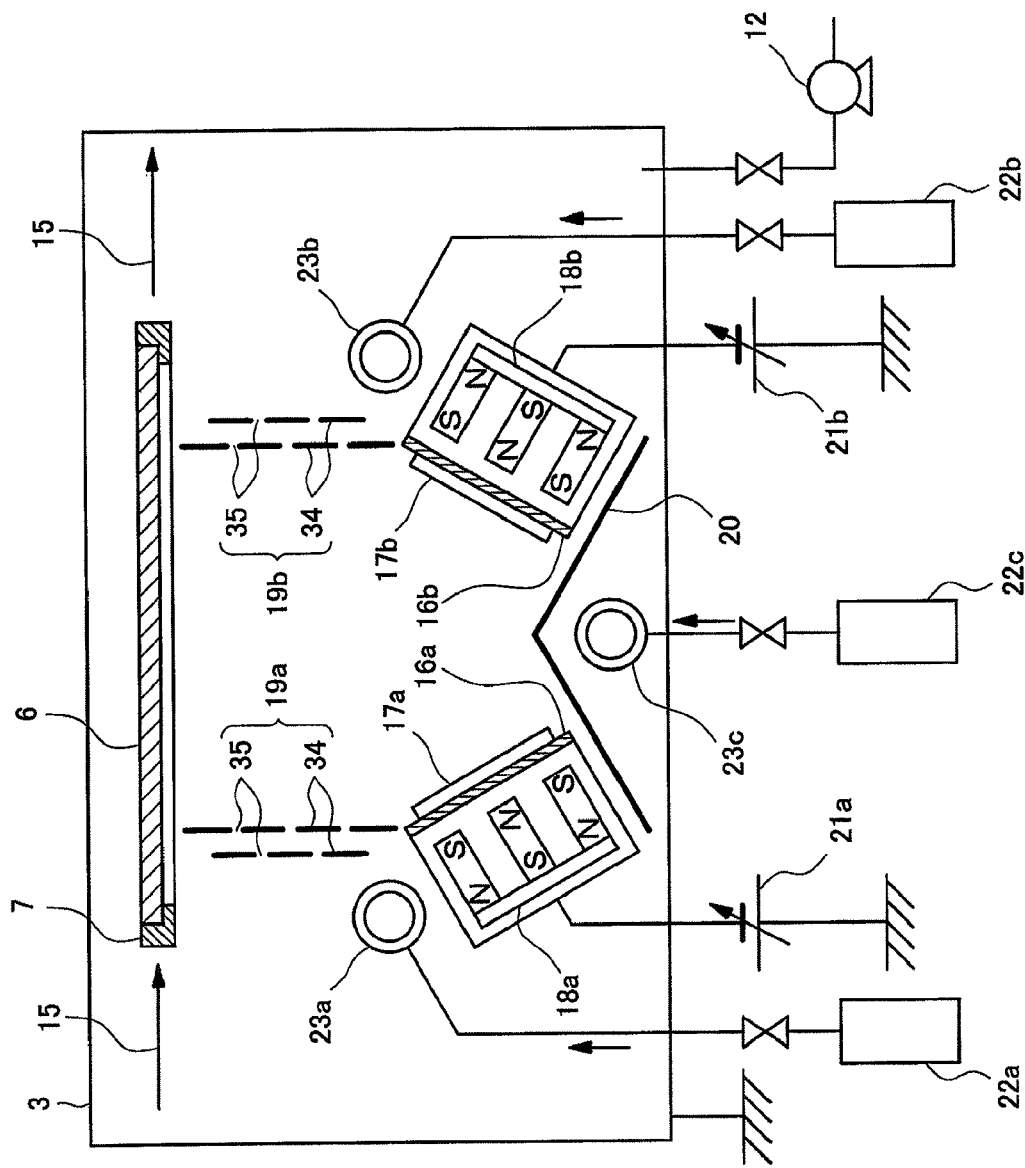
FIG. 7 is a schematic sectional view showing a fifth example of the sputtering chamber.

FIG. 7 is a schematic sectional view showing a fifth example of the sputtering chamber 3, which is basically configured in the same manner as the sputtering chamber 3 shown in FIG. 2, but the shields 19a, 19b are different. The shields 19a, 19b of this example are configured of plural plate members 34 which are arranged in parallel with a space between them in the directions of front and back surfaces. The individual plate members 34 have an opening 35. When the plural plate members 34 are viewed from a direction perpendicular to the plate members on the side of the space between the first target 17a and the second target 17b, the surfaces on the opposite sides with respect to the shields 19a, 19b are not visible. For example, the openings 35 of the adjacent plate members are positioned in displaced states not to overlap one another in the front and back directions. By configuring in this way, the particles can be prevented from flying out without disturbing the gas flow inside and outside of the shields 19a, 19b.

Figure 8:
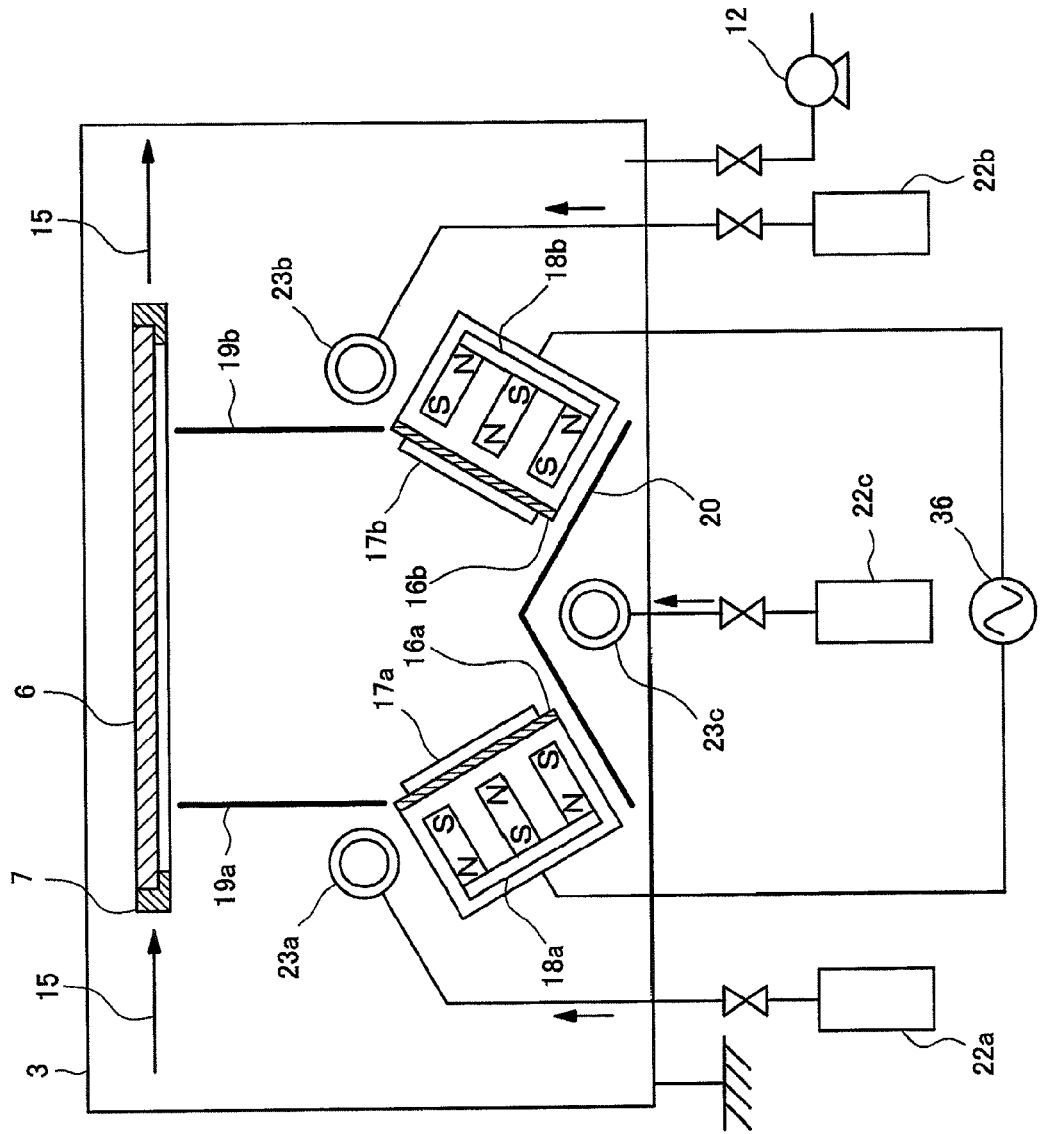
FIG. 8 is a schematic sectional view showing a sixth example of the sputtering chamber.

FIG. 8 is a schematic sectional view showing a sixth example of the sputtering chamber 3, which is basically configured in the same manner as the sputtering chamber 3 shown in FIG. 2, except that an AC power source 36 is connected to the cathodes 16a, 16b. Sputtering of the invention may be performed by applying a DC voltage as described above but can also be performed by applying an AC voltage as in this example. The AC power source 36 preferably has a frequency of 10 kHz to 300 kHz, and the frequency and waveform are adjusted according to the type and quality of the film to be formed.

Figure 9:
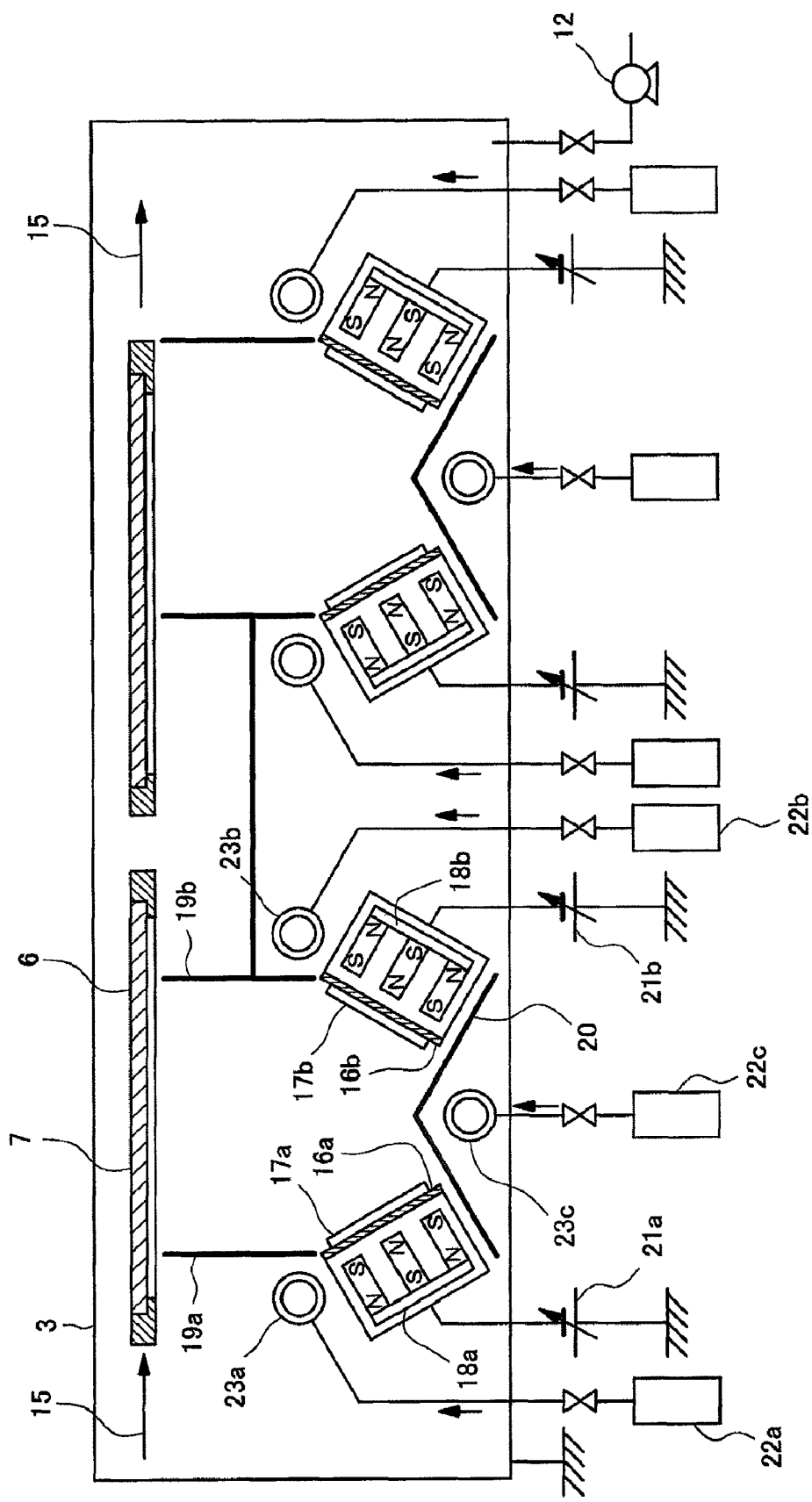
FIG. 9 is a schematic sectional view showing a seventh example of the sputtering chamber.

FIG. 9 is a schematic sectional view showing a seventh example of the sputtering chamber 3, which is basically configured in the same manner as the sputtering chamber 3 shown in FIG. 2. Differences include that a cathode unit provided with a first cathode 16a for holding a first target 17a, a second cathode 16b for holding a second target 17b and shields 19a, 19b is disposed in plural along the conveying path 15. The provision of the plural cathode units can improve the film-forming speed.

In the above example, the conveying path 15 is disposed at an upper part of the sputtering chamber 3, and the cathode unit is disposed at a lower part, but it can be also configured to dispose the cathode unit at an upper part of the sputtering chamber 3 and the conveying path 15 at a lower part. It is also possible to have a side deposition configuration that the cathode unit and the conveying path are disposed not in a vertical direction but in a horizontal direction to form a film by conveying the substrate 6 placed on the tray 7 in an erected state. In addition, the shields 19a, 19b are not disposed only at the front and back in the conveying direction of the substrate 6 but preferably disposed to surround the extended region in the space between the first target 17a and the second target 17b toward the conveying path 15. When the shields 19a, 19b are disposed to surround the extended region in the space between the first target 17a and the second target 17b toward the conveying path 15, the particles can be prevented from flying out more securely.

The apparatus of the invention can prevent the particles from diffusing in the chamber and can form a film without much damage, and the maintenance cost can also be reduced. An example that the present apparatus is applied to formation of a film is described.

Figure 10:
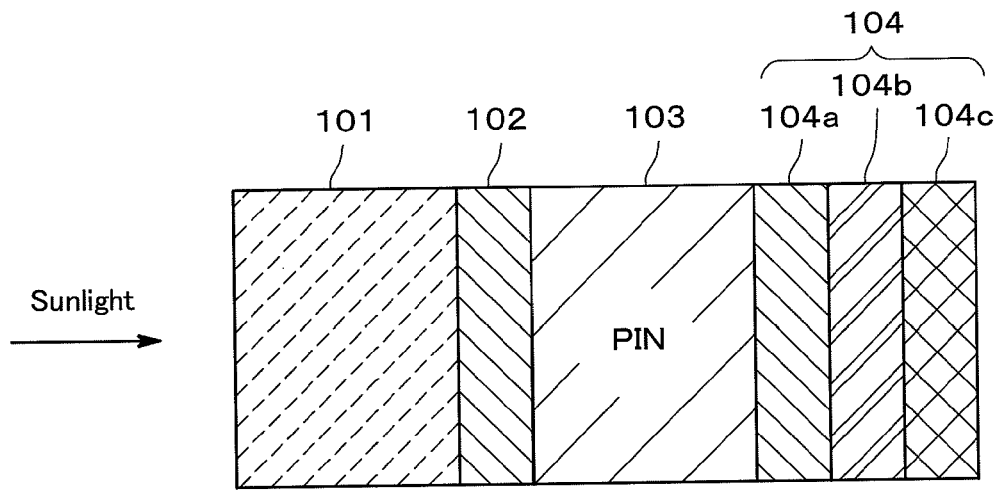
FIG. 10 is a typical schematic view of an Si thin film solar battery.

FIG. 10 is a typical schematic view of the Si thin film solar battery. 101 is a glass substrate, 102 is a front side transparent conductive film layer which is a window layer, 103 is a pin layer, 104 is a back side electrode comprising a back side transparent conductive film layer 104a, an Ag layer 104b and a Ti layer 104c. Here, the pin layer is comprised of three p-type, i-type and n-type layers and can be produced by a plasma CVD method or the like. For this solar battery, the film which can be formed by using the sputtering apparatus of the invention includes an Al-doped ZnO layer (hereinafter abbreviated as AZO layer) which is the front side transparent conductive film layer 102, and a three-layered film of the AZO layer which is the back side transparent conductive film layer 104a, the Ag layer 104b and the Ti layer 104c which configure the back side electrode 104. When the front side transparent conductive film 102 is a single layer film such as AZO, it can be realized as the structure described in the above-described sixth example. When the AZO film is arranged to face the targets, high energy particles come flying from the targets to deteriorate the properties by their influence, but the use of the apparatus of the invention can be expected to provide an effect of reducing damage to the AZO film itself. And, when it is a multilayer film such as the back side electrode 104, it can be realized in the structure described in the above-described seventh example, but as the cathode unit, it is required in three. As the effects of using the apparatus of the invention, it is possible to avoid not only damage to itself as described above when the first layer AZO is formed but also damage to the n-type Si film which is the uppermost layer of the pin layer equivalent to the base treated in the previous process.

Figure 11:
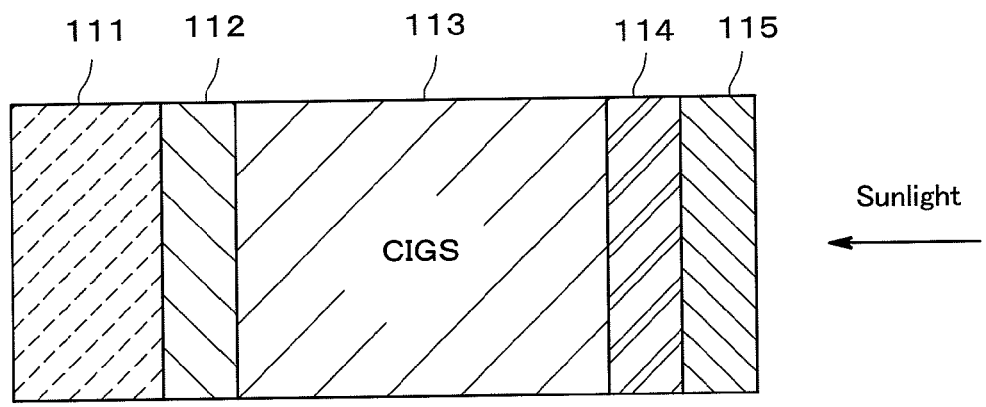
FIG. 11 is a typical schematic view of a Cu—In—Ga—Se based compound solar battery.

FIG. 11 is a typical schematic view of a Cu—In—Ga—Se (hereinafter abbreviated as CIGS)-based compound solar battery. 111 is a substrate such as glass, stainless steel or synthetic resin film, 112 is an Mo layer which is a back side electrode, 113 is a CIGS compound layer which is an electromotive portion, 114 is a buffer layer formed of, for example, CdS, and 115 is a two-layered film of ZnO and AZO which is a window layer. For example, a method of producing this solar battery forms the Mo layer 112 which is the back side electrode on the substrate 111 by a sputtering method. The CIGS compound layer 113 is formed by forming a two-layered film of CaGa alloy and In and annealing at a high temperature in an $H_2Se$ gas atmosphere to obtain a polycrystalline compound. The buffer layer 114 is formed of Cds by a chemical bath deposition method. Lastly, ZnO and AZO are used to configure the two-layered film 115 which is a window layer by a sputtering method. When the apparatus of the invention is applied to the process of forming the film by the sputtering method, for example, since the window layer is a multilayer film, it can be realized by the apparatus structure as described in the above-described seventh example, and the Mo layer 112 of a single layer can be realized by the apparatus structure as described in the above-described sixth example. As an effect of using the apparatus of the invention, when the two-layered film 115 of ZnO and AZO is formed, an effect to reduce damage to the buffer layer 114 which is equivalent to the base can be expected. And, when the two-layered film 115 of ZnO and AZO is formed, it also becomes possible to avoid damage to itself as described above.

It is also suitable to the production of an image display device having a large display area which is production by an in-line device. As an imaged is play device having a large display area, there are a liquid crystal display, a plasma display, an organic fluorescent display (e.g., organic EL display) and the like. The use of the apparatus of the invention provides an effect capable of reducing damage to the base layer or the layer itself during the production.

The invention claimed is:

1. A sputtering apparatus, wherein a conveying path for conveying a substrate is disposed in a sputtering chamber to which an exhaust device is connected;

a first cathode for holding a first target which is obliquely opposed toward a front in the conveying direction of the substrate and a second cathode for holding a second target which is obliquely opposed toward a back in the conveying direction of the substrate are arranged to obliquely face the conveying path;

a first shield on a side of the first cathode and a second shield on a side of the second cathode opposed to the conveying direction of the substrate are disposed between the conveying path and the first and second cathodes to have therebetween an extended region toward the conveying path in a space between the first target and the second target; and an end of the first shield on the side of the conveying path is present over a point where a vertical line to a second target surface erected on an end of the second target on the side of the conveying path intersects with the first shield and an end of the second shield on the side of the conveying path is present over a point where a vertical line to a first target surface erected on an end of the first target on the side of the conveying path intersects with the second shield.

2. The sputtering apparatus according to claim 1, wherein a cathode unit which is provided with the first cathode for holding the first target, the second cathode for holding the second target and the shields is disposed in plural along the conveying path.

3. The sputtering apparatus according to claim 1, wherein a magnet unit for generating a closed loop shape magnetic field on the surfaces of the first target and the second target is disposed on the back sides of the first cathode and the second cathode.

4. The sputtering apparatus according to claim 3, wherein the magnet unit has a rectangular shape with a transverse direction of the conveying path in a direction of the long side, has a structure that a center magnet is surrounded by an outer peripheral magnet having a reverse polarity of the center magnet, and is slidable in a direction of the short side.

5. The sputtering apparatus according to claim 1, wherein gas supply portions are disposed behind the shields.

6. The sputtering apparatus according to claim 1, wherein the shields are comprised of center plate portions which are disposed to mutually face and end plate portions which are attached to the ends of the center plate portions on the side of the conveying path and the ends on the sides of the first target and the second target in a direction to intersect with the center plate portions.

7. The sputtering apparatus according to claim 1, wherein the shields are configured of a plurality of plate members which have an inclination on the planes perpendicular to the conveying path, and the surfaces on the other side with respect to the shields are not visible when viewed from a direction perpendicular to a plane formed by connecting from the space between the first target and the second target to the center of the shield surface.

8. The sputtering apparatus according to claim 1, wherein the shields have a dogleg shape formed by externally bending to have a convex shape when viewed from the inside of the opposed shields.

9. The sputtering apparatus according to claim 1, wherein the shields are configured of a plurality of plate members which are arranged in parallel in the directions of front and back surfaces with a space between them; the individual plate members have an opening; and the space on the other side of the shields is not visible when the plurality of plate members are viewed from a direction perpendicular to the plate members on the side of the space between the first target and the second target.

10. The sputtering apparatus according to claim 1, wherein the shields are disposed to surround an extended region toward the conveying path in the space between the first target and the second target.

11. The sputtering apparatus according to claim 1, wherein an AC power source is connected to the first cathode and the second cathode which are obliquely faced.

12. The sputtering apparatus according to claim 1, wherein a DC power source is connected to the first cathode and the second cathode, the first cathode and the second cathode constitute a cathode, and the chamber wall and the shields in the sputtering chamber constitute an anode.

13. A method of producing a solar battery, comprising:
   forming a film by using the sputtering apparatus according to any one of claims 1 through 9 and 10 through 12.

14. A method of producing an image display device, comprising: forming a film by using the sputtering apparatus according to any one of claims 1 through 9 and 10 through 12.

* * * * *